United States Patent
Margalit et al.

(10) Patent No.: US 6,668,006 B1
(45) Date of Patent: Dec. 23, 2003

(54) INTEGRATED OPTICAL DEVICE FOR DATA COMMUNICATION

(75) Inventors: Moti Margalit, Zichron Yaagov (IL); Meir Orenstein, Haifa (IL)

(73) Assignee: Lambda Crossing Ltd., Caeseria (IL)

( * ) Notice: Subject to any disclaimer, the term of this patent is extended or adjusted under 35 U.S.C. 154(b) by 0 days.

(21) Appl. No.: 09/478,717

(22) Filed: Jan. 6, 2000

(30) Foreign Application Priority Data

Oct. 14, 1999 (IL) .................................................. 132385

(51) Int. Cl.$^7$ ........................... H01S 3/08; H01S 3/083; H01S 3/082

(52) U.S. Cl. .............................. 372/97; 372/92; 372/94; 385/2; 385/24

(58) Field of Search .............................. 372/97, 92, 94; 385/2, 24, 50

(56) References Cited

U.S. PATENT DOCUMENTS

| | | | |
|---|---|---|---|
| 4,775,214 A | 10/1988 | Johnson | 350/96.29 |
| 5,742,633 A | 4/1998 | Stone et al. | 372/92 |
| 6,009,115 A | * 12/1999 | Ho | 372/92 |
| 6,052,495 A | * 4/2000 | Little et al. | 385/2 |

FOREIGN PATENT DOCUMENTS

| | | |
|---|---|---|
| GB | 2118765 | 11/1983 |
| WO | 9853535 | 11/1998 |
| WO | 9857207 | 12/1998 |
| WO | 9917151 | 4/1999 |

OTHER PUBLICATIONS

Microring resonator channel dropping filters, Little et al, Journal of lightwave technology, vol. 15,No. 6, Jun. 1997.*
Little, B.E., et al. "Microring Resonator Channel Dropping Filters". Journal of Lightwave Technology, U.S. IEEE, vol. 15, No. 6 (1997) pp 998–1005.

* cited by examiner

Primary Examiner—Paul Ip
Assistant Examiner—Armando Rodriguez
(74) Attorney, Agent, or Firm—Ladas and Parry

(57) ABSTRACT

An optical device for use in data communication technique is presented. The device comprises a combination of two spaced-apart waveguides and at least two spaced-apart resonator-cavity loops. The resonator-cavity loops are accommodated between the two waveguides and connected to each other through sections of the waveguides in such a manner that the resonator-cavity loops and the waveguide sections create a closed loop compound resonator for storing optical energy of a predetermined frequency range. A control means is used for controlling physical characteristics of the compound resonator to adjust its optical storage characteristics.

24 Claims, 5 Drawing Sheets

INTEGRATED OPTICAL DEVICE FOR DATA COMMUNICATION

FIELD OF THE INVENTION

This invention is generally in the field of optical communication techniques, and relates to an integrated optical device particularly enabling frequency selection, switching, modulation and signal routing.

BACKGROUND OF THE INVENTION

Optical communication is the enabling technology for the information age, and the essential backbone for long haul communication. As this technology progresses, there is a tremendous interest in providing optical routes in the short haul, metropolitan and access networks, as well as in local area networks and cable TV networks. In all these networks, the best of breed solution for bandwidth expansion has been the adoption of wavelength division multiplexing (WDM), which entails the aggregation of many different information carrying light streams on the same optical fiber. A device capable of accessing an individual information stream is fundamentally required in current and future networks. These devices can also add information streams to the optical fiber, as well as impress information on an optical stream by optical modulation.

The basic building block for optical switching is the optical modulator/switch. Various implementations of such a device have been developed, of which the most dominant is the Mach-Zender Interferometer (MZI), in which interference is produced between phase coherent light waves that have traveled over different path lengths. The basic construction of MZI is schematically illustrated in FIG. 1. Light input to a modulator 1 is via a single-mode waveguide. A beam splitter divides the light into two equal beams that travel through guides 2A and 2B, respectively. By applying voltage to electrodes 4, the effective path lengths can be varied. Hence, the optical switching is achieved by creating a phase difference between two arms of the device (guides 2A and 2B), and controlling the optical power at the device output.

In general, the performance criteria for the operation of the wavelength routing elements include: the following:

(1) Modulation depth or contrast ratio, which signifies the ratio between two ("ON" and "OFF") or more states of a switch device;

(2) Crosstalk, which defines the ability of the device to select a single optical channel while suppressing information from the other channels;

(3) Electric power consumption;

(4) Modulation bandwidth, which defines the speed at which the switching can be achieved; and (5) Optical bandwidth within which the modulation is effective.

To achieve a good modulation performance with the MZI, the latter is typically designed with long interference arms. As a result, this device is not efficient in its implementation, and limits the scaling ability of complex optical circuits. Another drawback of MZI-type devices, in their predominant implementation, is their frequency insensitiveness over a desired frequency bandwidth. As a result, MZI-type devices cannot be used directly for wavelength routing.

To achieve wavelength routing, the MZI has been utilized in conjunction with wavelength demultiplexers, which provide spatial separation between different optical frequencies. To this end, a matrix composed of at least N times (N+1) MZI is used to redirect one of the N spatially distinct wavelengths to the device output. The remaining frequencies are recombined using a wavelength multiplexer.

Recently developed integrated electro-optical devices utilize resonant rings to achieve frequency selective switching. Such a device is disclosed, for example, in WO 99/17151. The main components of the device are illustrated in FIG. 2. A resonant ring 6 couples light from one fiber 8a to another fiber 8b, when the frequency of the light passing through the fiber 8a fulfils that of the resonance condition of the ring 6. By applying an electric field or a thermal source to the ring 6, its refractive index, and consequently, its resonance condition, can be desirably adjusted. Changing the resonance condition prevents the passage of the previously coupled light and acts as a switch. Alternatively, the loss of the ring waveguide can be changed. Adding loss to the ring diminishes its operation as a resonant cavity, and light cannot be coupled from fiber to fiber.

Unfortunately, the conventional resonant ring based systems require fabrication tolerances that are hard to implement by means of a conventional photolithography technique. This disadvantage becomes more essential in multiple-ring devices, wherein the distance between two locally adjacent rings is a critical factor for the successful operation of the device. The use of a switching mechanism providing de-tuning of a resonant ring out of resonance condition has been proposed, being disclosed for example in WO 98/53535. This solution, however, does not meet the extinction ratio and crosstalk requirements of communication systems.

SUMMARY OF THE INVENTION

There is accordingly a need in the art to improve the operation of electro-optical communication devices by providing a novel electro-optical device such as an optical frequency dependent switch and a modulator.

The present invention takes advantage of the use of several (at least two) ring resonators. The main idea of the present invention is based on designing an optical complex filter/resonator, wherein waveguide sections are specifically connected to ring resonators in a configuration which enables realization of optical switching, wavelength routing, lasing, wavelength sensitive amplification and optical filtering. The device may also combine a plurality of such filters in a wavelength router module. Generally speaking, the present invention utilizes the collective response of two or more closed loop resonators, which are connected to each other by two or more optical paths, for the purpose of switching or modulating a selected wavelength.

The fabrication technology of waveguides is well developed in many classes and families of materials. The relaxation of the fabrication tolerances in the present invention relates to the possibility of vertical coupling of light from the waveguides to the ring resonators. Since the vertical fabrication tolerances are much better then the horizontal tolerances, the result is a device which is simpler to manufacture. However the details and design of the invention extend beyond such devices in which only vertical coupling exists between the waveguides and resonators.

The optical resonator according to the invention is an enclosed cavity aimed at storing optical energy. As compared to the known devices of the kind specified, which utilize a closed-loop type optical resonator, and several such resonators cascaded in various configurations, the present invention utilizes the inclusion of a feedback path for the optical signal. In other words, in the present invention, the loop resonator serves as a frequency selective mirror within a more complex resonator. These mirrors together with connecting waveguides create closed loop cavities with superior performance and simpler fabrication, and, mainly, are favorable for inclusion of switching capabilities and active media, as compared to the conventional devices.

The wavelength response of a structure composed of several ring resonators coupled to optical waveguides is determined by the physical and geometrical parameters of the resonators and coupling scheme. The present invention provides novel schemes of coupling multiple resonators to achieve predetermined active filtering and modulation characteristics. These coupling schemes are relatively easy to implement, and provide desired modulation characteristics.

There is thus provided, according to one aspect of the present invention, an optical device comprising:

(a) a combination of two spaced-apart waveguides and at least two spaced-apart resonator-cavity loops accommodated between the two waveguides and connected to each other through sections of the waveguides, said at least two spaced-apart resonator-cavity loops and said waveguide sections creating a closed loop compound resonator for storing optical energy of a predetermined frequency range; and (b) a control means for controlling physical characteristics of the compound resonator to adjust its optical storage characteristics.

The predetermined frequency range is determined by physical and geometrical characteristics of the compound resonator. To control the physical characteristics of the waveguide and/or loop-resonators, a heating means may be used.

One of the two waveguides serves as an input and throughput waveguide, and the other serves as an output waveguide. An optical signal entering the input waveguide may include a plurality of light components having different wavelengths. By actively adjusting the response of the compound resonator, using a heater or any other means that changes the characteristics of the waveguide sections, one of these wavelengths may be switched from the input to the output waveguide.

The device may comprise additional waveguides and additional loop-resonators, forming together several such frequency selective switches, thereby providing complex optical signal switching and routing.

According to another aspect of the present invention, there is provided a wavelength router system comprising at least one optical switch and at least one optical filter, wherein the switch and the filter is constructed as the above-described integrated electro-optical device.

According to yet another aspect of the present invention, there is provided a laser device where an active material with gain is embedded in at least one of the parts comprising the above-described integrated electro-optical device. This multiple section laser can be controlled by applying the above-described control means to tune its lasing frequency, to q-switch or to passively/actively mode lock the laser device in order to obtain pulsed operation.

In general, the resonator-cavity loops (ring-resonators) can be replaced by lo any other implementation of a frequency-selective element that couple between the two waveguide sections. For example, optical gratings can be used.

Thus, according to yet another aspect of the present invention, there is provided an integrated electro-optical device comprising:

a combination of two spaced-apart waveguides and at least two spaced-apart wavelength-selective elements accommodated between the two waveguides and connected to each other through sections of the waveguides, said at least two spaced-apart wavelength-selective elements and said waveguide sections creating a closed loop compound resonator for storing optical energy of a predetermined frequency range; and a control means for controlling physical characteristics of the compound resonator to adjust its optical storage characteristics.

According to yet another aspect of the present invention there is provided a method for manufacturing the above device utilizing existing lithography techniques.

More specifically, the present invention is used with the ring-resonators and is therefore described below with respect to this application.

BRIEF DESCRIPTION OF THE DRAWINGS

In order to understand the invention and to see how it may be carried out in practice, a preferred embodiment will now be described, by way of a non-limiting example only, with reference to the accompanying drawings, in which.

DETAILED DESCRIPTION OF A PREFERRED EMBODIMENT

Figure 1:
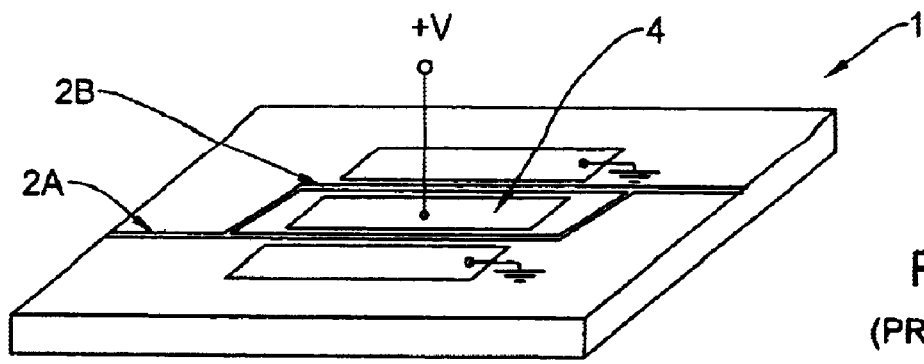
FIG. 1 is a schematic illustration of the MZI structure.
Figure 2:
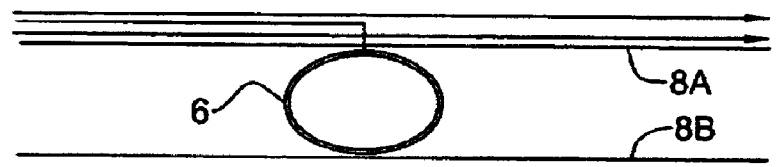
FIG. 2 is a schematic illustration of the conventional resonant ring based electro-optical device.

FIGS. 1 and 2 illustrate conventional MZI-type and ring-resonator type structures, respectively.

Figure 3A:
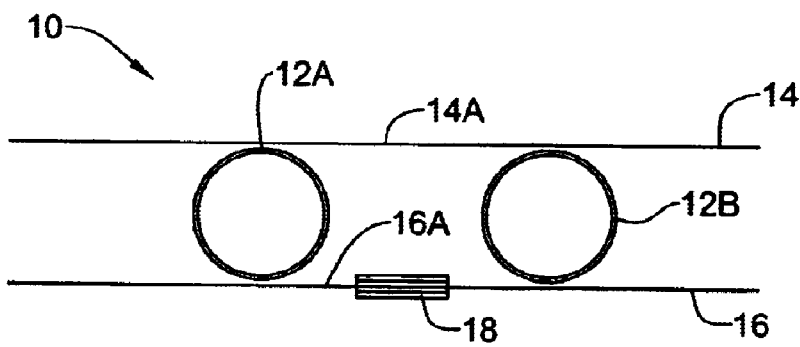
FIG. 3 is a schematic illustration of an electro-optical device according to one embodiment of the invention.
Figure 3B:
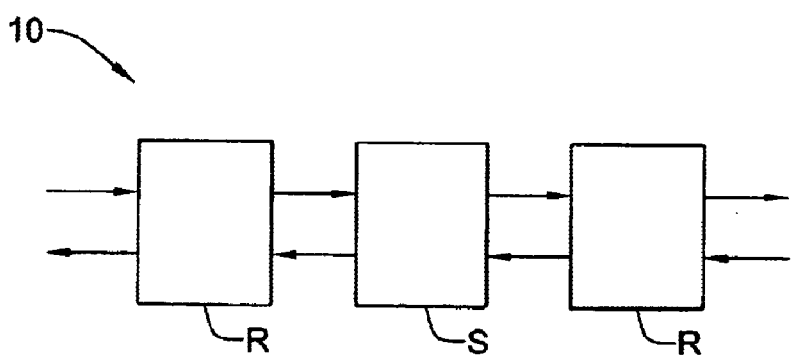

Referring to FIGS. 3a and 3b, there is illustrated an electro-optical device, generally designated 10, constructed and operated according to one embodiment of the invention. The device 10 includes a compound resonator, which, according to the present example, is composed of two ring-resonators 12A and 12B (constituting resonator-cavity loops functioning as frequency-selective elements), and two waveguides 14 and 16, wherein waveguide sections 14A and 16A connects the rings 12A and 12B to each other. As shown in FIG. 3b by way of block-diagram, these waveguide sections 14A and 16A present a spacer S between optical cavities defined by two ring-resonators R.

Further provided in the device 10 is a heater element 18 (electrodes) placed on either one of the waveguide sections—the section 16A in the present example. The operation of the heater element 18 enables to control the refractive index and consequently, the optical phase imparted by the waveguide spacer S. Generally speaking, the change in the refractive index will induce the required phase shift to change the frequency response of the compound resonator. Such an active phase affecting may be achieved by applying any suitable thermo-optic, piezo-electric, electro-optic or the like effects within the spacer or ring resonator regions.

The device 10 may be implemented as a multi-layer optical structure manufactured by a lithography technique. All the elements of the compound resonator, i.e., the ring-resonators and the waveguides, may be formed in the same optical layer. Alternatively, the compound resonator may be manufactured as a multi-layer structure, namely the waveguides may be located in a locally adjacent upper or lower layer with respect to the layer containing the ring-resonators. This facilitates the manufacture to meet the requirements for small spaces between the coupling elements (i.e., ring and waveguide).

The optical cavities (ring-resonators) are weakly coupled to the waveguides. Direct coupling between the two resonators is not required by this scheme. Each of the optical cavities is capable of supporting several resonance frequencies, which are determined by the geometrical and material details of the cavity. In the present example of FIGS. 3a and 3b, which is the simplest case utilizing a pair of ring-resonator cavities, the two cavities 12A and 12B are identical, namely tuned for the same frequency range of the resonance condition. A change in the refractive index of one of compound resonator's elements, which is the waveguide 16 in the present example, since the heating element 18 is associated with this waveguide), will cause changes in the roundtrip phase of the entire cavity, thereby shifting the resonance condition.

As indicated above, although the ring-resonators are exemplified here, any other implementation of the frequency-selective elements (mirrors) that couple between the two waveguide sections may be employed in the compound resonator for the purposes of the present invention. Such a frequency-selective element may, for example, be an optical gratings.

Figure 4:
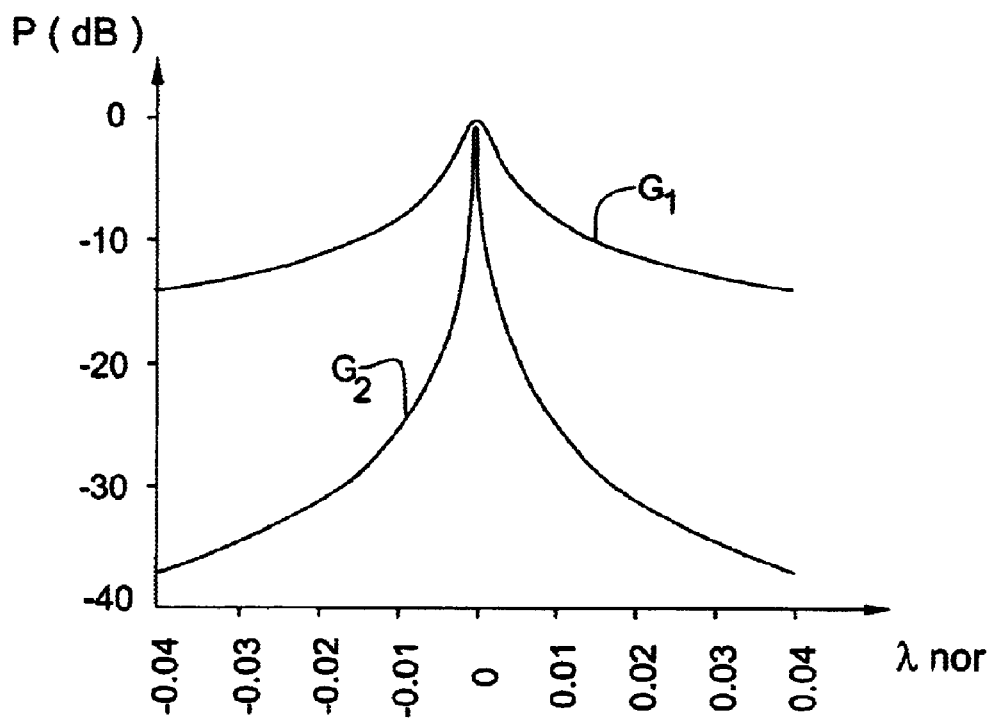
FIG. 4 graphically illustrates some advantageous features of the device of FIG. 2, as compared to the conventional devices.

Assuming that the waveguide 14 is an input waveguide, and the waveguide 16 is an output waveguide, the response of the compound resonator 10 is essentially different from that of the conventional single-ring resonator shown in FIG. 2. This is illustrated in FIG. 4, showing two graphs $G_1$ and $G_2$, presenting optical power P at the output waveguide (fiber) 16 as a function of a normalized wavelength $\lambda_{nor}$, corresponding, respectively, to the conventional device and device 10 constructed according to the invention. It is self evident that the filtering characteristics and out of band signal suppression of the coupled resonator 10 are much better then those of the conventional single-ring resonator.

Figure 5:
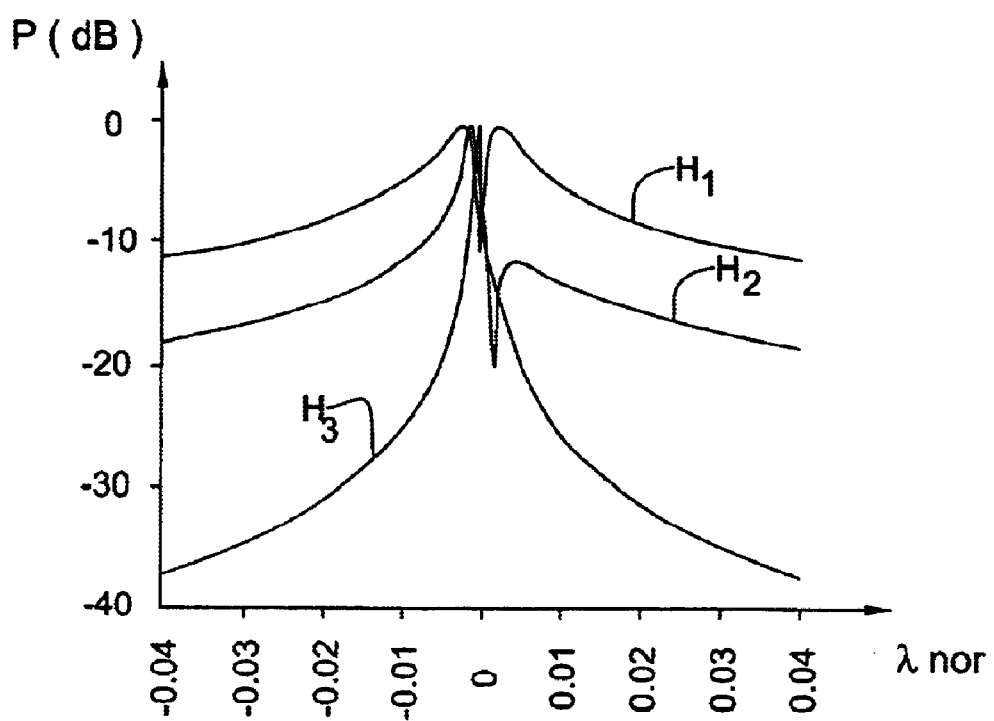
FIG. 5 graphically illustrates simulation results of the operation of the device of FIG. 2.

FIG. 5 illustrates simulation results of the operation of the device 10. Three graphs $H_1$, $H_2$ and $H_3$ presenting the output power P of the device 10 as a function of normalized wavelength $\lambda_{nor}$ for different phase shifts: $\phi=0$, $\phi=\pi/4$ and $\phi=\pi/2$, respectively.

Each of the ring-resonators (two in the present example) is comprised of a waveguide with the index or refraction ($n_{core}$) larger then its surrounding material ($n_{cladding}$). The waveguide is fashioned into a closed path, called "ring". The input waveguide passes below the ring-resonators in a manner to allow the overlap of the two waveguide modes and allow for transferring optical power from the input waveguide to the ring-resonator. As for the output waveguide, it is also placed so as to attain the coupling to the ring. This output waveguide may serve as the output of the selected frequency. Alternatively, when the device 10 is to be used as a modulator, this waveguide can also serve as a throughput port for optical frequencies different from that of the modulated signal.

The operation of the device 10 is characterized by the low loss propagation of the optical mode in the ring waveguide. This is achieved by utilizing a refractive index contrast between the waveguide and surrounding material. The ring may be composed of optical glass with a refractive index of about 1.6–1.9, may be made from silicon (refraction index of 3.5) or a layered-structure made of suitable materials such as used in Vertical Emitting Cavity Lasers (VECSELs). It is known that the ring itself manifests on frequencies corresponding to its resonance condition. The resonant frequency of the ring, f0, is given by:

$$f_0 = \frac{Mc}{2\pi R n_{ef}} \qquad (1)$$

wherein R is the ring radius measured from the center of the ring to the center region of the ring waveguide; $n_{ef}$ is the effective refraction index of the ring waveguide; M is an integer value; and c is the speed of light propagation in vacuum. The effective refraction index can be determined by various known techniques.

One of the important parameters defining the characteristics of the entire device 10, is the coupling between the ring and the waveguide, since it determines the optical bandwidth and photon lifetime, and, consequently, the modulation efficiency. The power exchange between the waveguide and the ring is denoted by $k^2$, and can be calculated by computing the overlap integral of the modes of the ring and waveguide multiplied by the interaction length. The optical bandwidth, $\Delta f$, is then determined as follows:

$$\Delta f = \frac{k^2 f^2}{2\pi^2 R n_{ef}} \qquad (2)$$

As seen in FIG. 3b, the individual ring-resonator actually presents a two-port device. The throughput function describing the ring optical amplitude characteristics is given by:

$$T(\omega) = \frac{1}{\sqrt{1-k}} \frac{(1-k)(1-e^{j\omega t})}{1-(1-k)e^{j\omega t}} \qquad (3)$$

while the drop function is given by:

$$D(\omega) = \frac{k}{1-(1-k)e^{j\omega t}} \qquad (4)$$

Here, $\omega$ is the radial frequency given by: $\omega=2f$.

The matrix describing one ring is given by:

$$M_{Ring} = 1 \Big/ T \begin{bmatrix} 1 & -D \\ D & T^2 - D^2 \end{bmatrix} \qquad (5)$$

Complex structures can be obtained by multiplying the matrixes of the corresponding sections. This calculation technique is known per se, and is used in analyzing complex distributed feedback lasers.

Turning back to FIG. 3a, it should be understood that, if at least one of the frequency-selective elements (ring resonators) 12A or 12B or at least one of the waveguide sections 14A or 16A is filled with an active medium, the device 10 can operate as a laser.

Figure 6A:
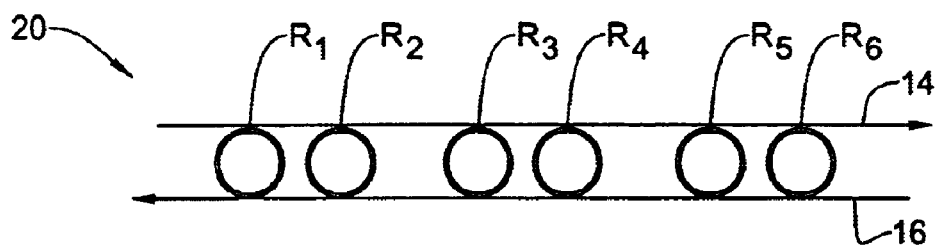
FIGS. 6a to 6c schematically illustrate electro-optical devices according to three different embodiments of the invention, respectively, suitable for designing complex filter structures.
Figure 6B:
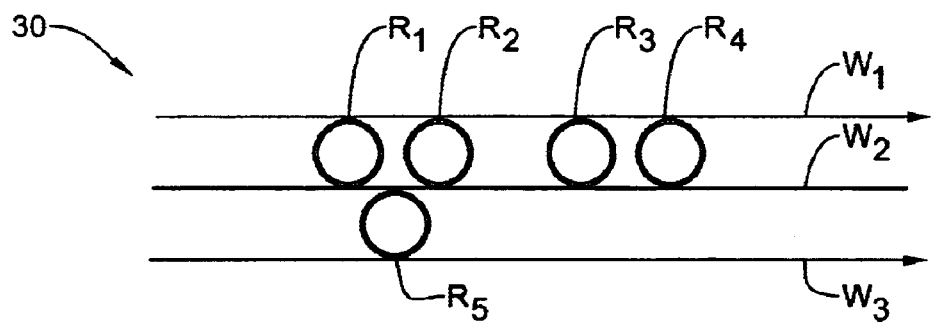
Figure 6C:
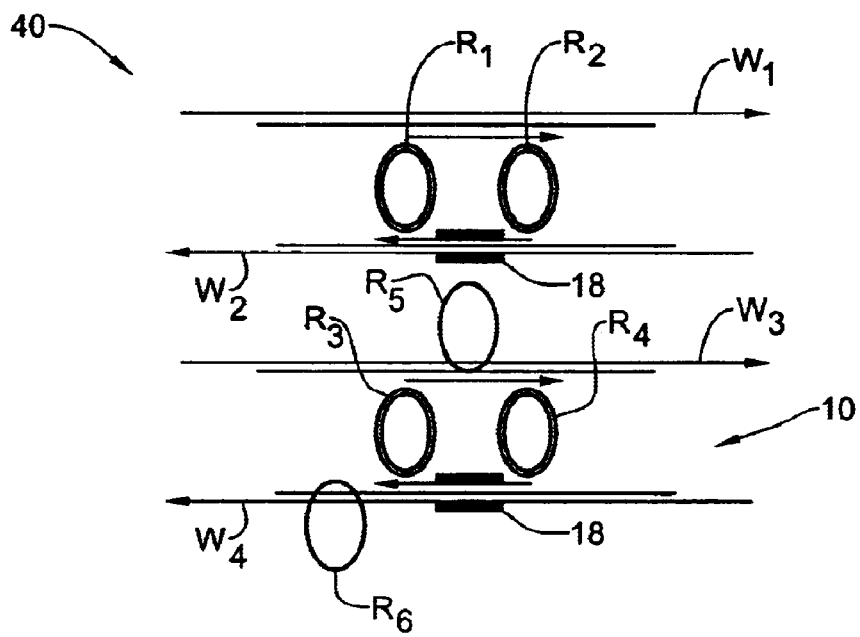
Figure 7A:
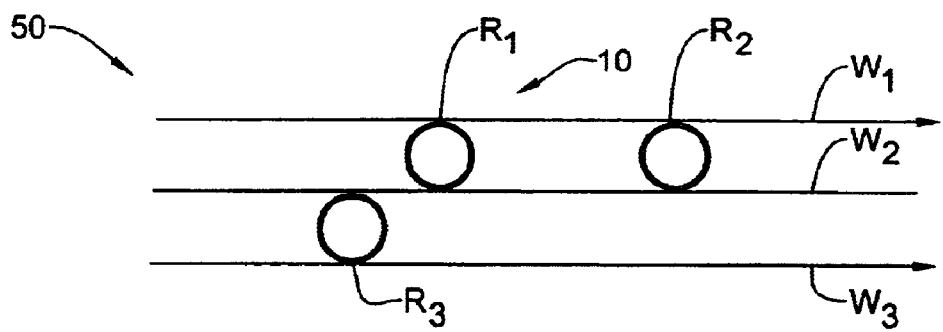
FIGS. 7a to 7c illustrate three more examples, respectively, of complex filter structures constructed according to the invention.
Figure 7B:
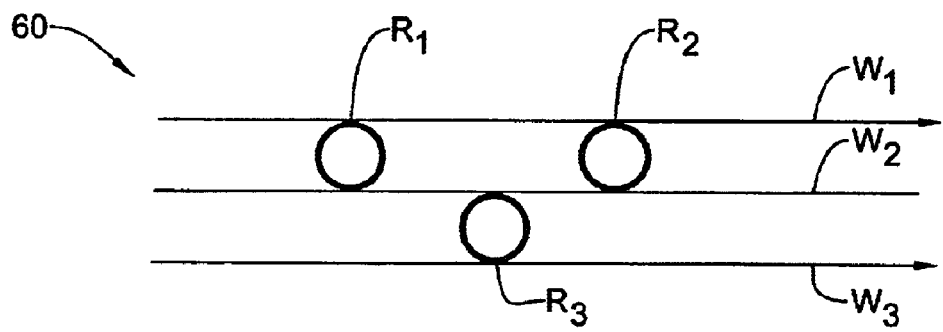
Figure 7C:
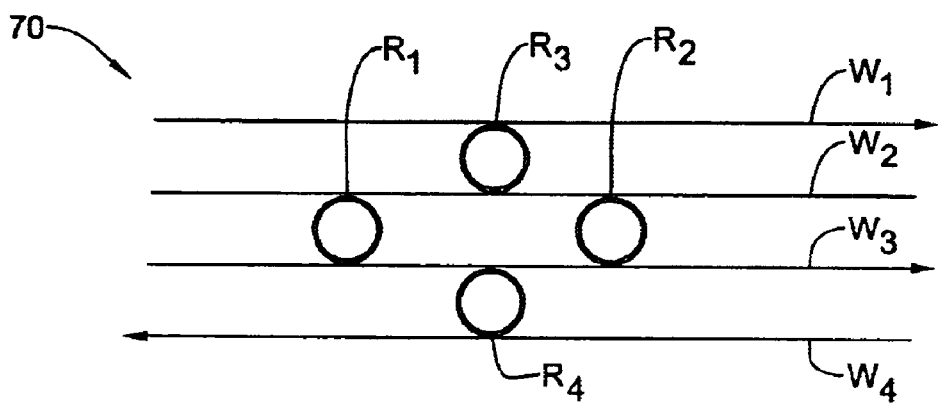

As known, an optical communication system typically requires stringent switching and routing. A single resonant ring device usually cannot meet these requirements. To this end, according to the present invention, filters are designed either as single stage coupled compound resonators, or as multiple-stage coupled compound resonators. Compound resonators of such filtering devices are illustrated in FIGS. 6a–6c, being designated 20, 30 and 40, respectively. Each of these devices utilizes the compound resonator structure 10 of FIG. 3a as a frequency selective switch/modulator, in which the ring-resonators R are coupled both in the forward and back directions, thereby increasing the degrees of freedom in the design of filters. It should be understood that, in all the examples, the matrix model is used in the synthesis and analysis of the filter/switch/modulator characteristics.

In the example of FIG. 6a, the entire waveguide cavity is formed by waveguides 14 and 16, and three pairs of ring-resonators $R_1$–$R_2$, $R_3$–$R_4$ and $R_5$–$R_6$ enclosed therebetween. In the example of FIG. 6b, a multi-stage coupled compound resonator 30 is composed of two pairs of rings $R_1$–$R_2$ and $R_3$–$R_4$ enclosed between waveguides $W_1$ and $W_2$, and an additional ring-resonator $R_5$ coupled to an additional waveguide $W_3$. A multi-stage coupled compound resonator 40 (FIG. 6c) comprises two compound resonators 10, and two additional ring-resonators $R_5$ and $R_6$, the latter being is coupled to an output waveguide $W_4$. By appropriately adjusting the index of the waveguide in the corresponding compound resonator, the desired wavelength may be switched from the input to the output waveguide.

Figure 8:
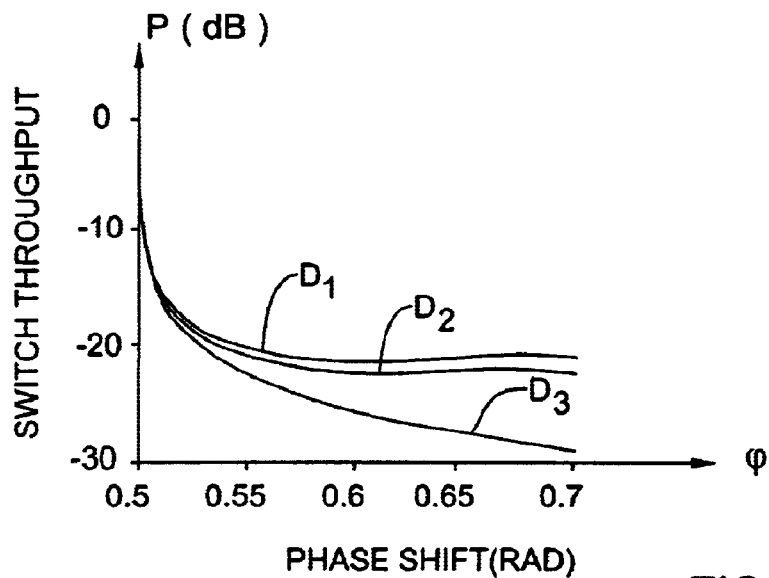
FIG. 8 graphically illustrates the operational principles of the devices of FIGS. 7a–7c.

Reference is now made to FIGS. 7a–7c and 8, illustrating the main constructional and operational principles of three other devices 50, 60 and 70, respectively, that are capable of operating as a switch or modulator. The devices 50, 60 and 70 have somewhat different design of waveguides and rings arrangement, as compared to the previously described examples, as illustrated in the figures in a self-explanatory manner using same reference number to identify those components, which are common in all examples. FIG. 8 Illustrates three graphs $D_1$ $D_2$ $D_3$, corresponding to simulation results of the operation of the devices 50, 60 and 70, respectively. Each graph presents the optical power P at the output fiber ($W_2$ $W_3$ $W_4$, respectively) as a function of a phase shift (p in the waveguide section. As clearly seen in the figure, for very small values of the phase shift $\phi$, more than 20 dB of signal extinction is obtained. This enables the size required by the waveguide sections to be significantly reduced, since the optical phase shift is accumulated over the length of the waveguide.

The advantages of the device according to the invention are thus self-evident. The device attains attractive modulation characteristics, requires very small phase shifts, and, consequently, the interaction region, as well as the switching power, can be minimized. The extinction ratio of the optical signal meets optical communication standards.

Figure 9:
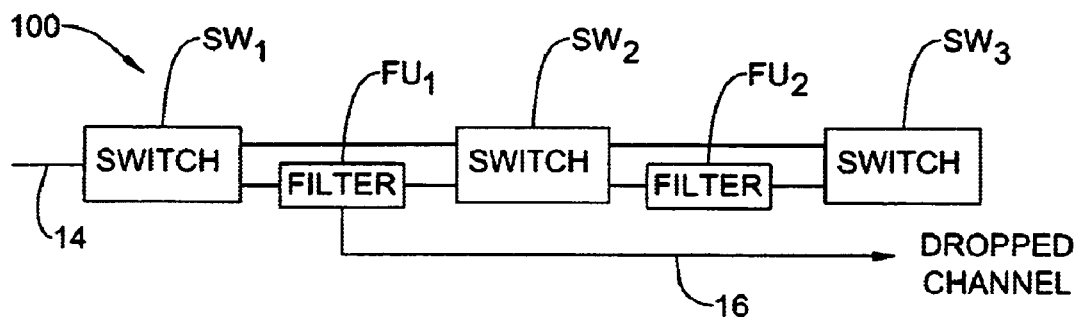
FIG. 9 schematically illustrates a block diagram of a wavelength router system utilizing the devices according to the invention.

FIG. 9 illustrates a block diagram of a system 100 utilizing the above-described devices to form a wavelength router. The system comprises three switches $SW_1$, $SW_2$ and $SW_3$, and two filter units $FU_1$ and $FU_2$. Each of the filter units is accommodated between two locally adjacent switches, and is designed so as to, when being actuated, route a specific optical frequency. In this example, one of the filters is activated at a time, thereby enabling the routed wavelength to be dynamically chosen. Obviously, a plurality of switching mechanisms can be used to increase the number of drop ports. It is important to note that this technique requires a considerably lower number of switches than that of the MZI switching matrix. Indeed, for an N-channel, M-drop system, the MZI switching matrix would require at least (N+M) by N matrix, while the system according to the present invention would require N switches with an M by M matrix.

The present invention can also be used for actively monitoring the switch performance. As is known, on of the crucial issues in modern communication systems is the status of the on-line switches. A non-operative switch in either the "ON" or "OFF" position can degrade the performance of the communication network. Modern communication systems utilize an erbium-doped fiber to compensate for loses in the optical fiber, connectors and devices. The amplifier emits amplified spontaneous emission (ASE) in all optical frequencies, which are of interest.

Figure 10:
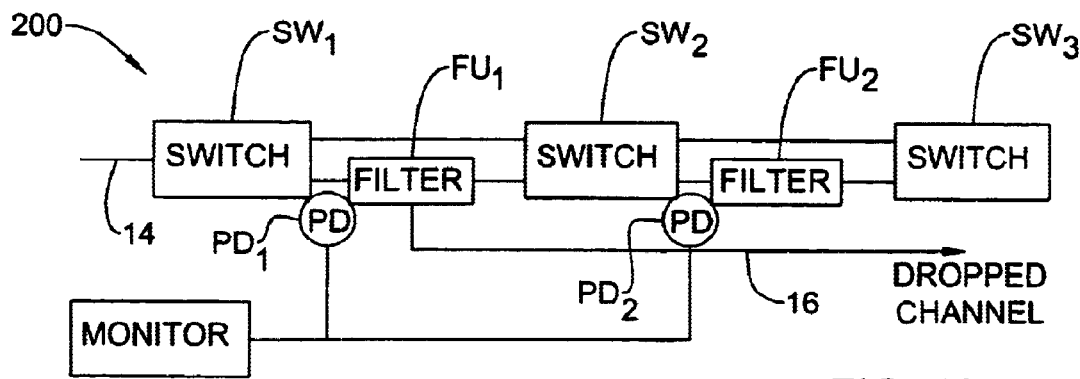
FIG. 10 illustrates a system utilizing the optical switches and filters according to the invention, and using ASE for monitoring the status of the optical switches.

In the present invention, it is proposed to use an ASE for monitoring the status of the optical switches. This concept is illustrated in FIG. 10, showing a system 200 that utilizes the components of the above-described system 100, and two photodetectors $PD_1$ and $PD_2$. Each photodetector is placed at the output of the corresponding switch and is coupled to a control unit (monitor) CU that monitors the optical power though this switch. Since the ASE exists at all frequencies, it can be used to monitor and control the switches.

Those skilled in the art will readily appreciate that various modifications and changes can be applied to the preferred embodiment of the present invention as herein before exemplified without departing from its scope defined in and by the appended claims. In the method claim which follow, characters which are used to designate claim steps, are provided for convenience only and do not apply any particular order of performing the steps.

What is claimed is:

1. An optical device comprising:
   (a) a combination of two spaced-apart waveguides and at least two spaced-apart resonator-cavity loops accommodated in a spaced-apart relationship between said two waveguides, each of said at least two spaced-apart resonator cavity loops being optically coupled to the two waveguides, and said at least two spaced-apart resonator-cavity loops being optically coupled to each other through sections of said waveguides in the space between the resonator-cavity loops, said at least two spaced-apart resonator-cavity loops and said sections of said waveguides creating a closed loop compound resonator cavity for storing optical energy of a predetermined frequency range adjustable by controlling physical characteristics of the compound resonator; and
   (b) a control means associated with either one of the waveguide sections for affecting a change in a roundtrip phase of the compound resonator cavity, thereby controlling the physical characteristics of the compound resonator to adjusts its optical storage characteristics.

2. The device according to claim 1, wherein said control means is further associated with either one of the resonator cavities.

3. The device according to claim 1 wherein said control means comprises heating means.

4. The device according to claim 1, wherein said control means comprises electro-optic means.

5. The device according to claim 1, wherein said control means comprises piezo-optic means.

6. The device according to claim 1, functioning as a switch.

7. The device according to claim 1, functioning as a modulator.

8. The device according to claim 1, wherein the resonator-cavity loops and the waveguides are arranged within same optical layer.

9. The device according to claim 1, wherein the resonator cavity loops are arranged within same optical layer, and the waveguides are arranged in a locally adjacent layer.

10. The device according to claim 1, and also comprising at least one additional pair of resonator-cavity loops, all the resonator cavity loops being aligned is a line between the two waveguides.

11. The device according to claim 1, wherein said resonator-cavity loops are filled with an optically active medium providing optical gain, the device thereby operating as a laser or amplifier.

12. The device according to claim 1, wherein said waveguide sections are filled with an optically active medium providing optical gain, the device thereby operating as a laser or amplifier.

13. The device according to claim 7, wherein said resonator-cavity loops are filled with an optically active medium providing optical loops.

14. The device according to claim 7, wherein said waveguide sections are filled with an optically active medium providing optical loss.

15. A controlled laser device comprising:
a combination of two spaced-apart waveguides and at least two spaced-apart resonator-cavity loops accommodated between the two waveguides and connected to each other through sections of said waveguides, said at least two spaced-apart resonator-cavity loops and said waveguide sections creating a closed loop compound resonator for storing optical energy of a predetermined frequency range, wherein at least one of said waveguide sections or said closed loop resonators is filled with an optically active medium providing gain effect; and
a control means associated at least with either one of the waveguide sections for affecting a change in a roundtrip phase of the compound resonator cavity, thereby controlling the physical characteristics of the compound resonator to adjust its optical storage characteristics.

16. The device according to claim 15, wherein said control means is used to Q-switch said controlled laser.

17. A waveguide router system comprising at least one optical switch and at least one optical filter connected to an output of said at least one optical switch, wherein each of the switch and the filter comprises a combination of two spaced-apart waveguides and at least two spaced-apart resonator-cavity loops accommodated between the two waveguides and connected to each other through sections of the waveguides, the resonator cavities and the waveguide sections creating a closed loop compound resonator for storing optical energy of a predetermined frequency range, a control means associated at least with either one of the waveguide sections for affecting a change in a roundtrip phase of the compound resonator cavity, thereby controlling the physical characteristics of the compound resonator to adjust its optical storage characteristics.

18. An integrated electro-optical device comprising:
a combination of two spaced-apart waveguides and at least two spaced-apart wavelength-selective elements accommodated between the two waveguides and connected to each other through sections of the waveguides, said at least two spaced-apart wavelength-selective elements and said waveguide sections creating a closed loop compound resonator for storing optical energy of a predetermined frequency range; and
a control means associated at least with either one of the waveguide sections for affecting a change in a roundtrip phase of the compound resonator cavity, thereby controlling the physical characteristics of the compound resonator to adjust its optical storage characteristics.

19. The device according to claim 1, wherein said compound resonator is a multi-layer structure, the waveguides and the resonator-cavity loops being located in two different layers, respectively, of the multi-layer structure.

20. An optical device comprising:
(a) a combination of two spaced-apart waveguides and at least two resonator-cavity loops accommodated in a spaced-apart relationship between said two waveguides, each of said at least two spaced-apart resonator cavity loops being optically coupled to the two waveguides, and said at least two spaced-apart resonator-cavity loops being optically coupled to each other through sections of said waveguides in the space between the resonator-cavity loops, said at least two spaced-apart resonator-cavity loops and said sections of said waveguides creating a closed loop compound resonator cavity for storing optical energy of a predetermined frequency range adjustable by controlling physical characteristics of the compound resonator
(b) at least one structure composed of an additional resonator-cavity loop optically coupled to said compound resonator through one of said two waveguides, and an additional waveguide coupled to said additional resonator-cavity loop; and
(c) a control means for controlling the physical characteristics of the compound resonator to adjust its optical storage characteristics.

21. An optical device comprising:
(a) a combination of two spaced-apart waveguides and at least two resonator-cavity loops accommodated in a spaced-apart relationship between said two waveguides, each of said at least two spaced-apart resonator cavity loops being optically coupled to the two waveguides, and said at least two spaced-apart resonator-cavity loops being optically coupled to each other through sections of said waveguides in the space between the resonator-cavity loops, said at least two spaced-apart resonator-cavity loops and said sections of said waveguides creating a closed loop compound resonator cavity for storing optical energy of a predetermined frequency range adjustable by controlling physical characteristics of the compound resonator;
(b) a plurality of structures each composed of an additional resonator-cavity loop optically coupled to said compound resonator through one of said two waveguides, and an additional waveguide coupled to said additional resonator-cavity loop, operable to form together a plurality of frequency selective switches, thereby providing for complex optical signal switching and routing; and
(c) a control means for controlling the physical characteristics of the compound resonator to adjust its optical storage characteristics.

22. A controlled laser device comprising:

a combination of two spaced-apart waveguides and at least two spaced-apart resonator-cavity loops accommodated between the two waveguides and connected to each other through sections of said waveguides, said at least two spaced-apart resonator-cavity loops and said waveguide sections creating a closed loop compound resonator for storing optical energy of a predetermined frequency range, wherein at least one of said waveguide sections or said closed loop resonators is filled with an optically active medium providing gain effect; and a control means for controlling the physical characteristics of the compound resonator to adjust its optical storage characteristics, said control means operating for passively or actively mode locking of said controlled laser.

23. A wavelength router system comprising at least one switch and at least one optical filter connected to an output of said at least one optical switch, wherein each of the switch and the filter comprises a combination of two spaced-apart waveguides and at least two spaced-apart resonator-cavity loops accommodated between the two waveguides and connected to each other through sections of the waveguides, the resonator cavities and the waveguide sections creating a closed loop compound resonator for storing optical energy of a predetermined frequency range; a control means for controlling physical characteristics of the composed resonator to adjust its optical storage characteristics; and a control unit including at least one photodetector connected to the output of the switch for monitoring optical power through the switch.

24. An electro-optical device comprising:

a combination of two spaced apart waveguides and at least two spaced-apart grating elements accommodated between the two waveguides and connected to each other through sections of the waveguides, said at least two spaced-apart grating elements and said waveguide sections creating at closed loop compound resonator for storing optical energy of a predetermined frequency range; and a control means for controlling physical characteristics of the compound resonator to adjust its optical storage characteristics.

\* \* \* \* \*